United States Patent [19]
Chen et al.

[11] Patent Number: 6,153,446
[45] Date of Patent: Nov. 28, 2000

[54] METHOD FOR FORMING A METALLIC REFLECTING LAYER IN A SEMICONDUCTOR PHOTODIODE

[75] Inventors: Ming-I Chen, Tainan Hsien; Yung-Chieh Fan, Hsinchu, both of Taiwan

[73] Assignee: United Microelectronics Corp., Hsinchu, Taiwan

[21] Appl. No.: 09/192,166

[22] Filed: Nov. 13, 1998

[51] Int. Cl.[7] ........................................ H01L 21/00
[52] U.S. Cl. ................................. 438/72; 257/436
[58] Field of Search ........................ 438/57, 69, 72; 257/290, 436

[56] References Cited

U.S. PATENT DOCUMENTS 5,721,429  2/1998  Radford et al. .

Primary Examiner—Charles Bowers
Assistant Examiner—Keith Christianson
Attorney, Agent, or Firm—Charles C. H. Wu; Charles C. H. Wu & Associates

[57] ABSTRACT

A method for forming a metallic reflecting layer in a semiconductor photodiode including a CMOS photodiode to enhance the sensitivity by filling a trench formed in the isolation next to the depletion region of the semiconductor photodiode with high reflectivity metal. The metal filled in the trench is used as a metallic reflecting layer to increase the number of photons reaching the depletion region by reflecting part of the aslope incident photons. An insulator is formed on the top of the metallic reflecting layer to electrically insulate the metallic reflecting layer from other conducting device formed by the follow-up process.

10 Claims, 4 Drawing Sheets

METHOD FOR FORMING A METALLIC REFLECTING LAYER IN A SEMICONDUCTOR PHOTODIODE

BACKGROUND OF THE INVENTION

1. Field of the Invention

This invention relates to a method for fabricating a photodiode, and more particularly, a method for forming a metallic reflecting layer for enhancing the sensitivity of a semiconductor photodiode.

2. Description of Related Art

A photodiode is a device that converts photo energy into an electrical signal through a P-N junction metal-oxide-semiconductor ("MOS") device. When a light ("photon") with sufficient energy is beamed onto a photodiode, the light energy generates electron-hole pairs in the P region and the N region of the P-N junction MOS device. When an electrical field is applied to both ends of a photodiode, the electron-hole pairs flow toward the P-N junction, specifically, the electrons flow toward the N region and the holes flow toward the P region. The congregated electrons and holes at the P-N junction generate electrical signals.

As a matter of industry practice, a commercial image sensor such as a charge-couple device (CCD) may contain a number of MOS photodiodes. Due to the fact that it is difficult to manufacture consistent sizes for MOS diodes and the high cost associated with manufacturing MOS diodes, and that complementary metal-oxide-semiconductor ("CMOS") has shown to be easier to manufacture consistent sizes and lower cost, therefore, the current industry practice is that CMOS photodiodes have been used to replace MOS photodiodes. Additionally, comparing to MOS photodiodes, CMOS photodiodes consume less power. Thus, the usage of CMOS photodiodes is attractive in imaging sensing devices.

FIG. 1 is a schematic cross-sectional view showing the structure of a conventional CMOS photodiode.

Referring to FIG. 1, a conventional CMOS photodiode consists of a gate 106, a first source/drain region 112, and a second source/drain region 113. The gate 106 is formed on a gate oxide layer 105 over a P-well 101 of a substrate 100, wherein the gate 106 is surrounded by a first spacer 108 and a second spacer 107. There is a first lightly doped drain (LDD) 109 formed beneath the first spacer 107, and neighboring to the first source/drain region 112. Similarly, there is a second LDD 110 formed beneath the second spacer 108, and neighboring to the first source/drain region 113. The second source/drain region 113 is used as a depletion region. The foregoing structure is formed within an active region 104 partitioned by isolations 103 and 103.

When photons pass through the transparent gate oxide layer 105 and reach the depletion region 113, electrons and holes generated by the photoelectric effect form a electrical signal at the P-N junction of the aforesaid CMOS photodiode. It is common knowledge in the semiconductor physics that when certain amount of photons is beamed at a photodiode, the sensitivity of each photodiode directly relates to the number of photons reaching the depletion region. Typically, it had been an industry practice for the purpose of enhancing the sensitivity of a photodiode, increasing the top surface area of the depletion region allowing more photons to arrive at the depletion region. However, as CMOS photodiodes are becoming more integrated on a piece of semiconductor, the aforesaid method of increasing the sensitivity of a photodiode by extending the top surface area of the depletion region has become more unpractical.

SUMMARY OF THE INVENTION

It is therefore an objective of the present invention to provide a method for forming a metallic reflecting layer in a semiconductor photodiode that enhances the sensitivity of a semiconductor photodiode including a CMOS photodiode without disturbing the semiconductor fabrication integration process.

It is another objective of the present invention to provide a method for forming a metallic reflecting layer in a semiconductor photodiode that enhances the sensitivity of a semiconductor photodiode including a CMOS photodiode without adding additional cost to the process.

In according with the foregoing and other objectives of the present invention, the method for forming a metallic reflecting layer in a semiconductor photodiode according to the invention enhances the sensitivity of a semiconductor photodiode including a CMOS photodiode by adding a metallic reflecting layer in the isolation next to the depletion region. The added metallic reflecting layer increases the number of photons reaching the depletion region by reflecting part of the aslope photons to the depletion region.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

The invention provides a new method for forming a metallic reflecting layer in a semiconductor photodiode including a CMOS photodiode to enhance the sensitivity of the photodiode. FIGS. 2A through 2I are schematic cross-sectional views illustrating the process of the method for a metallic reflecting layer in a CMOS photodiode of the invention.

Figure 1:
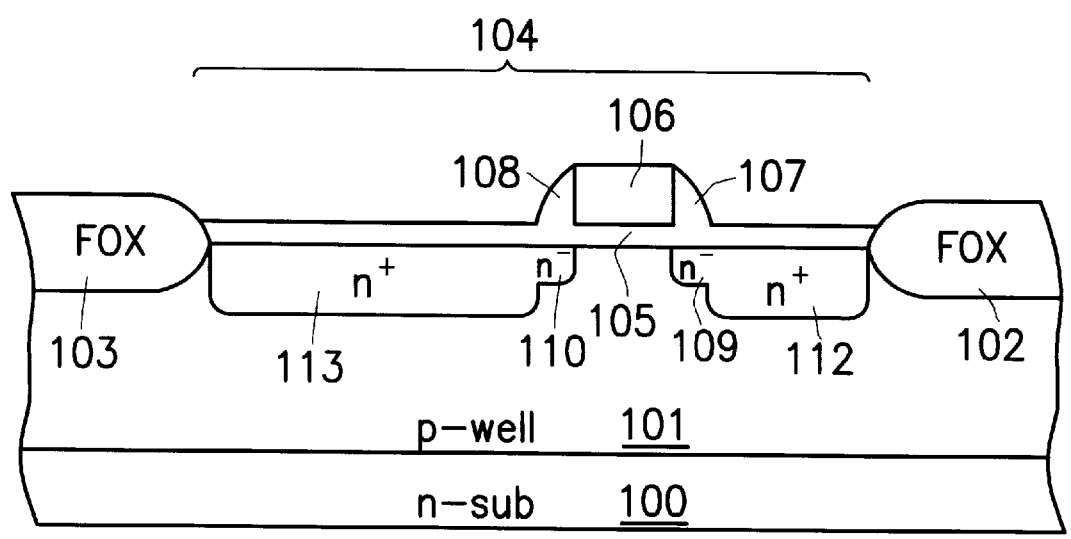
FIG. 1 is a schematic cross-sectional view showing a conventional structure of CMOS photodiode.
Figure 2A:
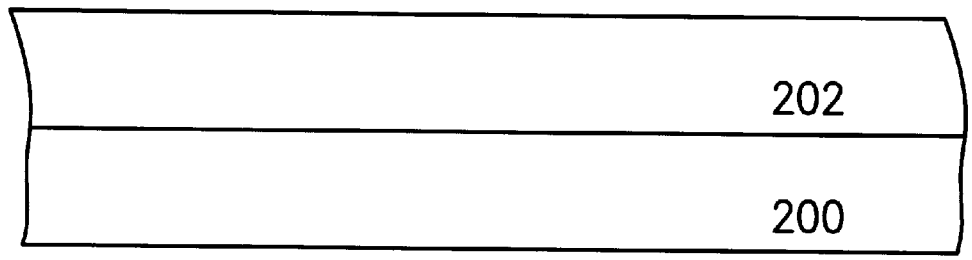
FIGS. 2A through 2I are schematic cross-sectional views showing a method for fabricating a CMOS photodiode of a preferred embodiment according the invention.
Figure 2B:
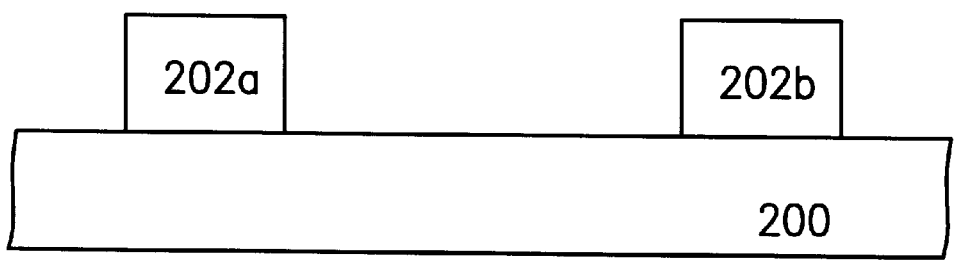

Referring to FIGS. 2A and 2B, a field oxide layer 202 is formed on a provided substrate 200, such as a silicon substrate. The field oxide layer 202 is then patterned into a first isolation 202a and a second isolation 202b.

Figure 2C:
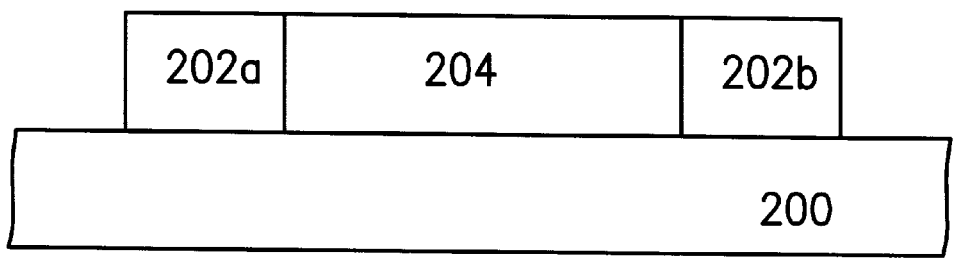

Referring next to FIG. 2C, by performing a selective epitaxy process, a P-well of epitaxial silicon 204 is formed between the isolations 202a and 202b. The epitaxial-silicon P-well 204 is the foundation of the CMOS photodiode formed by the follow-up process, wherein the CMOS photodiode contains a depletion region closer to the first isolation 202a.

Figure 2D:
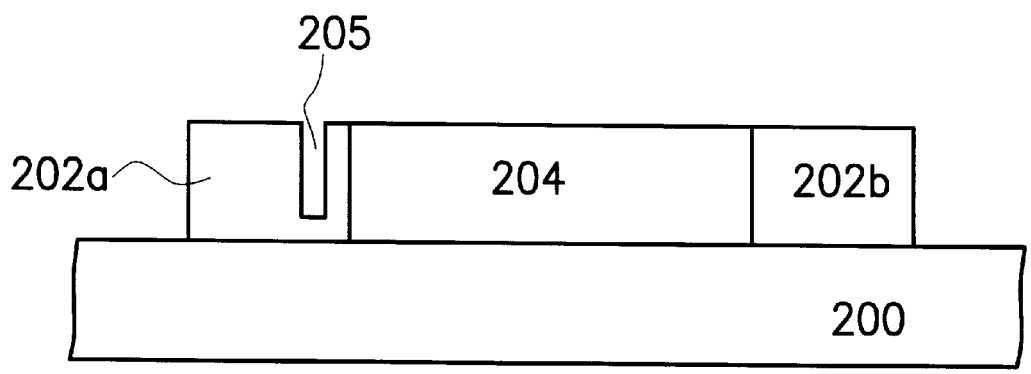
Figure 2E:
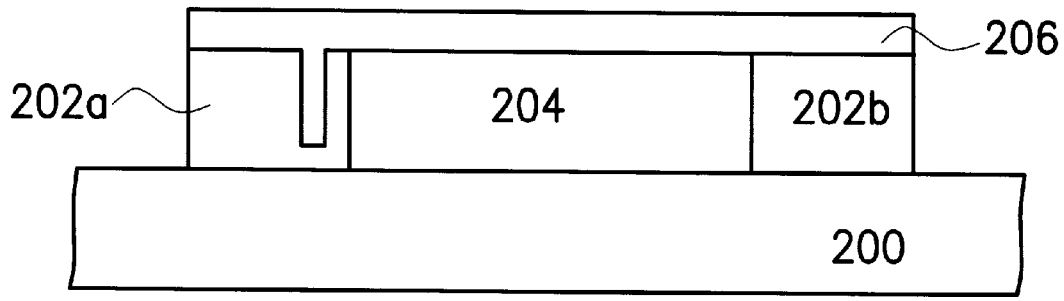

As shown in FIG. 2D, a trench 205 is formed in the first isolation 202a by performing a conventional photolithography and etching process. Then, as referring to FIG. 2E, a high-reflectivity metal layer 206 is formed on the top of the isolations 202a, 202b, and the epitaxial-silicon P-well 204, and filled in the trench 205. The metal layer 205 can be tungsten, titanium or other metals having a high reflectivity index.

Figure 2F:
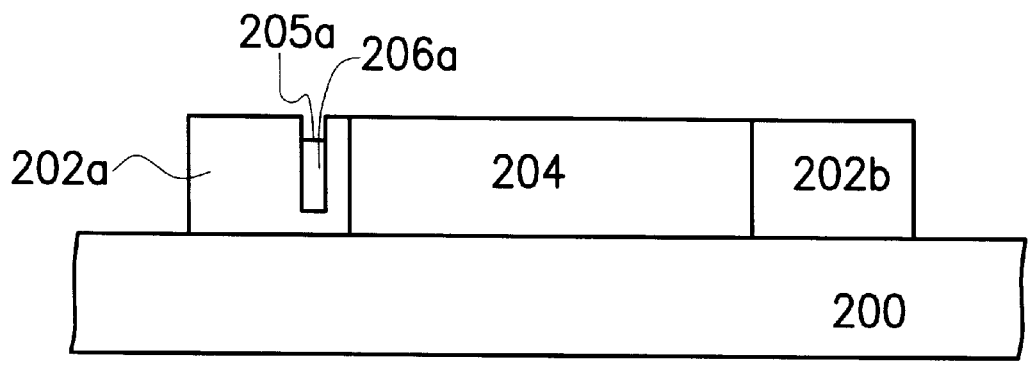

Referring to FIG. 2F, the metal layer 206 over the isolations 202a, 202b and the epitaxial-silicon P-well 204 is removed by a process such as dry etching. By further performing an etching back process, a portion of the metal in the trench is removed, so that the top level of the metal layer 206a in the trench 205 is slightly lower than the top level of the first isolation 202a. As a result, a very shallow trench 205a is formed in the first isolation 202a.

Figure 2G:
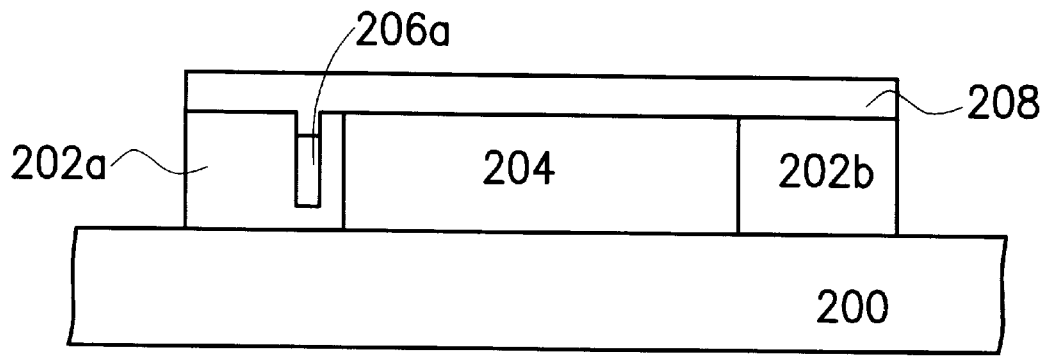

Referring next to FIG. 2G, an insulator 208 is formed on the substrate 200 and filled in the shallow trench 205a. The insulator 208 can be $SiO_2$, or SiN formed by a process such as chemical vapor deposition, or other processes achieving the same result and properties.

Figure 2H:
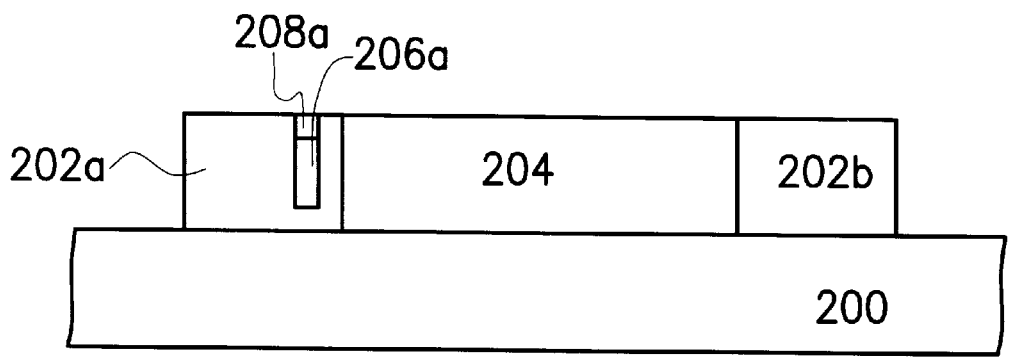

The insulator 208 over the isolations 202a, 202b and the epitaxial-silicon P-well 204 is removed by an etching back process as shown in FIG. 2H. The remaining insulator 208a is used to electrically insulate the metal layer 206a from other conducting layers formed by the follow-up process.

Figure 2I:
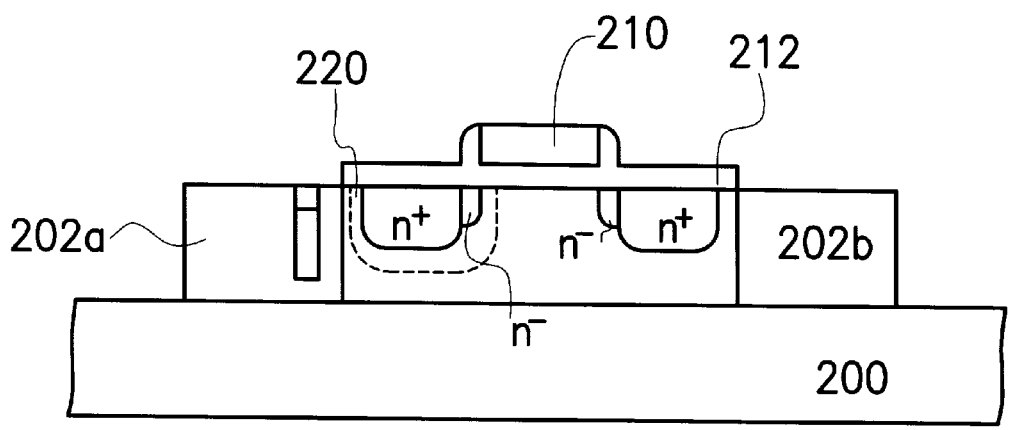

Referring to FIG. 2I, a conventional CMOS process is performed to form a CMOS photodiode over the epitaxial-silicon P-well 204, which basically contains a depletion region 220, gate oxide layer 212, a gate 210 source/drain region $n^+$, and lightly doped drains $n^-$. When the CMOS photodiode of the invention is placed under an illuminated environment, in addition to the existing photons, the aslope photons are also able to reach the depletion region 220 through the reflection of the metal layer 206a. Therefore, the number of photons that are effective to excite the photo-electric effect is increased and thus enhances the sensitivity of the CMOS photodiode.

The invention has been described using exemplary preferred embodiments. However, it is to be understood that the scope of the invention is not limited to the disclosed embodiments. On the contrary, it is intended to cover modifications and similar processes. The scope of the claims, therefore, should be accorded the broadest interpretation so as to encompass all such modifications and similar processes.

What is claimed is:

1. A method for forming a metallic reflecting layer in a complementary metal-oxide-semiconductor (CMOS) photodiode, the method comprising the steps of:

providing a silicon substrate;

forming a first isolation and a second isolation on the substrate, wherein the first isolation and the second isolation partition off a region;

forming an epitaxial silicon layer on the substrate between the first isolation and the second isolation;

forming a trench in the first isolation;

forming the metallic reflecting layer in the trench, wherein a top level of the metallic reflecting layer is lower than a top level of the first isolation, and wherein the metallic reflecting layer filled in the trench forms a shallow trench in the first isolation;

filling the shallow trench with an insulating material to form an insulator; and forming the CMOS photodiode in and on the epitaxial silicon layer, wherein the CMOS contains a depletion region, and wherein the depletion region is in the epitaxial silicon layer and next to the first isolation.

2. The method of claim 1, wherein the step of forming the metallic reflecting layer in the trench comprises steps of:

forming a high-reflectivity metal layer over the substrate to cover the epitaxial silicon layer, the first isolation and the second isolation, wherein the high-reflectivity metal layer fills the trench formed in the first isolation;

removing the high-reflectivity metal layer located on the epitaxial silicon layer, the first isolation and the second isolation; and removing a potion of the high-reflectivity metal layer filled in the trench to form the shallow trench.

3. The method of claim 2, wherein the high-reflectivity metal layer includes tungsten.

4. The method of claim 2, wherein the high-reflectivity metal layer includes titanium.

5. The method of claim 2, wherein the step of removing the high-reflectivity metal layer located on the epitaxial silicon layer, the first isolation and the second isolation includes dry etching.

6. The method of claim 2, wherein the step of removing a portion of the high-reflectivity metal layer filled in the trench includes etching back.

7. The method of claim 1, wherein the step of filling the shallow trench with an insulating material to form a insulator comprises steps of:

forming an insulating layer over the substrate, wherein the insulating layer fills the shallow trench; and removing the insulating layer from top of the epitaxial silicon layer, the first isolation and the second isolation.

8. The method of claim 7, wherein the insulating layer includes $SiO_2$.

9. The method of claim 7, wherein the insulating layer includes SiN.

10. The method of claim 7, wherein the step of forming an insulating layer includes chemical vapor deposition.

* * * * *